United States Patent
Yang et al.

(10) Patent No.: US 7,875,967 B2
(45) Date of Patent: Jan. 25, 2011

(54) INTEGRATED CIRCUIT WITH STEP MOLDED INNER STACKING MODULE PACKAGE IN PACKAGE SYSTEM

(75) Inventors: DeokKyung Yang, Hanam-si (KR); In Sang Yoon, Ichon-si (KR); Jae Han Chung, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 48 days.

(21) Appl. No.: 12/045,646

(22) Filed: Mar. 10, 2008

(65) Prior Publication Data

US 2009/0224390 A1 Sep. 10, 2009

(51) Int. Cl.
- H01L 23/02 (2006.01)
- H01L 29/40 (2006.01)
- H01L 23/28 (2006.01)

(52) U.S. Cl. .................. 257/686; 257/787; 257/786; 257/777; 257/783; 257/723; 257/E23.123; 257/E23.085; 257/E23.126; 438/107; 438/109; 438/127; 361/758; 361/790

(58) Field of Classification Search ............... 257/686, 257/787–789, 786, 777, 783, 723, 725, 790, 257/E23.123, E23.126, E23.085; 438/107, 438/109, 127; 361/790, 758
See application file for complete search history.

(56) References Cited

U.S. PATENT DOCUMENTS

| | | | | |
|---|---|---|---|---|
| 5,222,014 A | * | 6/1993 | Lin | 361/792 |
| 5,396,403 A | * | 3/1995 | Patel | 361/705 |
| 5,644,169 A | * | 7/1997 | Chun | 257/787 |
| 5,754,230 A | * | 5/1998 | Tsuruta | 348/333.12 |
| 5,763,312 A | | 6/1998 | Jeng et al. | |
| 6,069,408 A | * | 5/2000 | Honda et al. | 257/787 |
| 6,867,487 B2 | * | 3/2005 | Huang et al. | 257/687 |
| 7,053,476 B2 | | 5/2006 | Karnezos | |
| 7,081,678 B2 | * | 7/2006 | Liu | 257/778 |
| 7,250,676 B2 | * | 7/2007 | Wang | 257/723 |
| 7,250,677 B1 | * | 7/2007 | Lin et al. | 257/723 |
| 7,253,511 B2 | * | 8/2007 | Karnezos et al. | 257/686 |
| 7,354,800 B2 | * | 4/2008 | Carson | 438/109 |
| 7,361,986 B2 | * | 4/2008 | Yuan et al. | 257/718 |
| 7,402,454 B2 | * | 7/2008 | Zhou et al. | 438/64 |
| 7,446,409 B2 | * | 11/2008 | Yang | 257/707 |
| 7,635,917 B2 | * | 12/2009 | Wang et al. | 257/723 |
| 2004/0048416 A1 | * | 3/2004 | Takase | 438/106 |
| 2004/0124518 A1 | * | 7/2004 | Karnezos | 257/686 |
| 2004/0195700 A1 | * | 10/2004 | Liu | 257/780 |
| 2006/0012018 A1 | * | 1/2006 | Karnezos et al. | 257/678 |
| 2006/0113663 A1 | * | 6/2006 | Yuan et al. | 257/718 |
| 2007/0278658 A1 | * | 12/2007 | Karnezos et al. | 257/692 |
| 2008/0057863 A1 | * | 3/2008 | Jalali | 455/13.2 |
| 2008/0142957 A1 | * | 6/2008 | Wang et al. | 257/723 |

\* cited by examiner

Primary Examiner—Zandra Smith
Assistant Examiner—Jeremy J Joy
(74) Attorney, Agent, or Firm—Mikio Ishimaru

(57) ABSTRACT

An integrated circuit package system including: providing a substrate; mounting an integrated circuit above the substrate; mounting an inner stacking module, having an inner stacking module encapsulation and a molded integral step molded in the inner stacking module encapsulation, above the integrated circuit; and encapsulating the inner stacking module, and the integrated circuit with an encapsulation.

20 Claims, 3 Drawing Sheets

INTEGRATED CIRCUIT WITH STEP MOLDED INNER STACKING MODULE PACKAGE IN PACKAGE SYSTEM

TECHNICAL FIELD

The present invention relates generally to an integrated package system, and more particularly to a system for using a step molded inner stacking module.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes which have significant impacts on manufacturing integration, in that they must be generally small, light weight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging and materials engineering and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high speed computer devices which are projected to exceed one TeraHertz (THz) in the near future. The current technologies, materials, equipment, and structures offer challenges to the basic assembly of these new devices while still not adequately addressing cooling and reliability concerns.

The envelope of technical capability of next generation IC package assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus a need still remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a substrate; mounting an integrated circuit above the substrate; mounting an inner stacking module, having an inner stacking module encapsulation and a molded integral step molded in the inner stacking module encapsulation, above the integrated circuit; and encapsulating the inner stacking module, and the integrated circuit with an encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
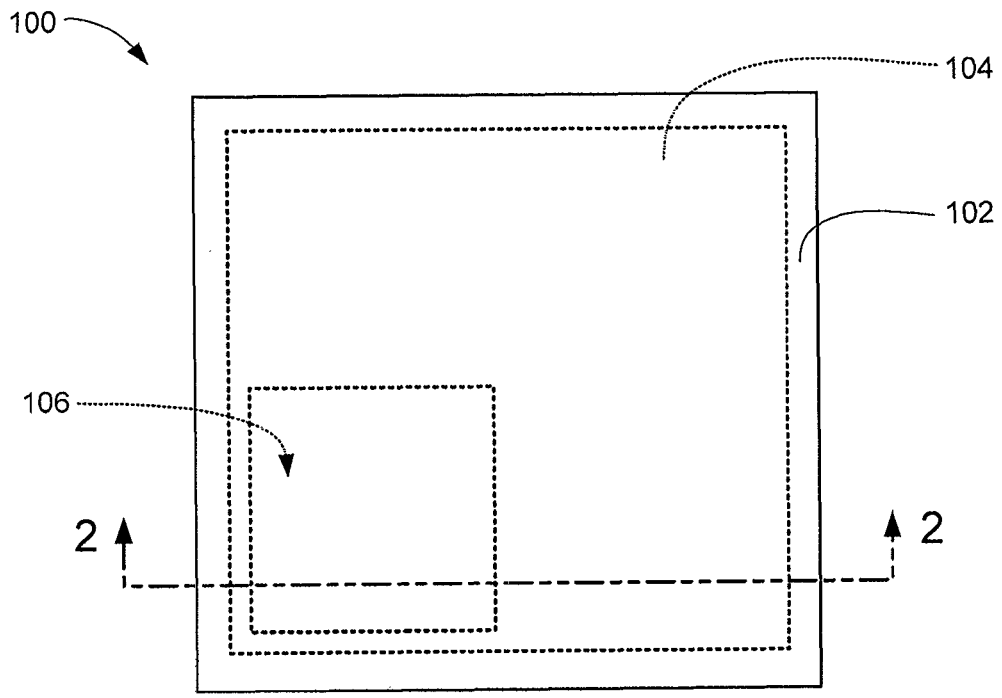
FIG. 1 is a top view of an integrated circuit package system, in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGS. Also, where multiple embodiments are disclosed and described having some features in common, for clarity and ease of illustration, description, and comprehension thereof, like features one to another will ordinarily be described with like reference numerals.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "system" as used herein refers to and is defined as the method and as the apparatus of the present invention in accordance with the context in which the term is used.

Referring now to FIG. 1, therein is shown a top view of an integrated circuit package system 100 in a first embodiment of the present invention. The integrated circuit package system 100 is shown having an encapsulation 102, such as an epoxy mold compound (EMC).

The encapsulation 102 is shown encapsulating an inner stacking module 104. The inner stacking module 104 is shown having a molded integral step 106 largely comprising one quadrant beneath the inner stacking module 104.

Figure 2:
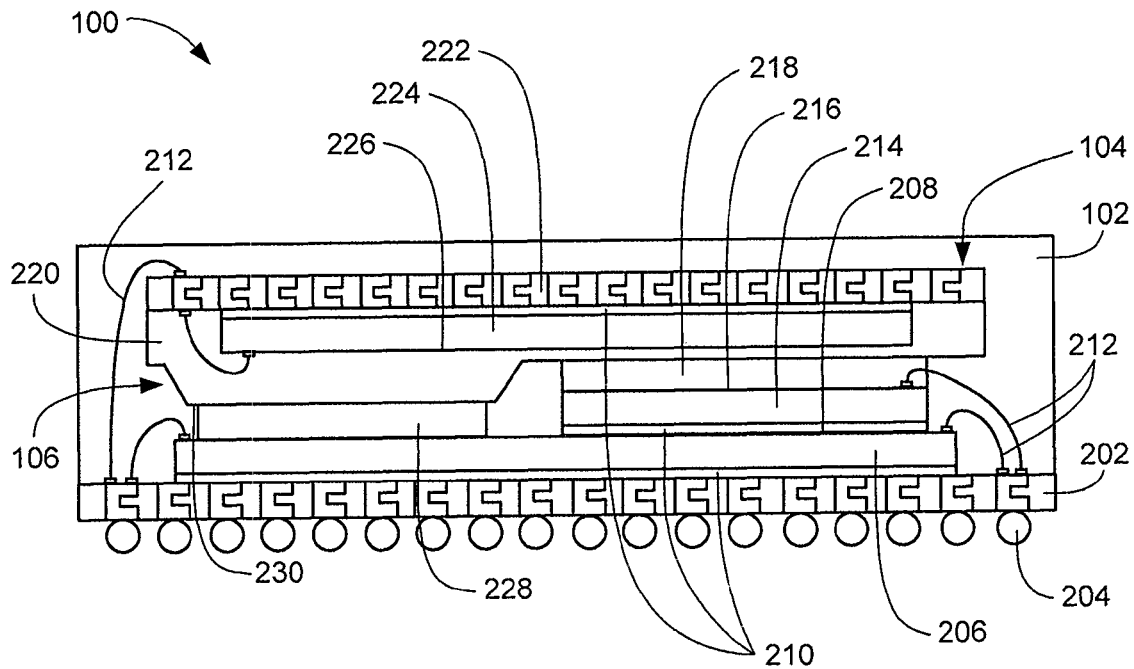
FIG. 2 is a cross sectional view of the integrated circuit package system along the line 2-2 of FIG. 1.

Referring now to FIG. 2, therein is shown a cross sectional view of the integrated circuit package system 100 along the line 2-2 of FIG. 1. The integrated circuit package system 100 is shown having a substrate 202, such as a laminated plastic or ceramic substrate.

Below the substrate 202 are attached external interconnects, such as solder balls 204. Above the substrate 202 is mounted an integrated circuit, such as an application specific integrated circuit (ASIC) 206 with an active side 208.

The ASIC 206 is attached to the substrate 202 with a die attach adhesive 210. The ASIC 206 is connected to the substrate 202 with bond wires 212 attached to the active side 208. Above the ASIC 206 is mounted a wire-bonded die 214, such as an analog integrated circuit, with an active side 216.

The wire-bonded die 214 is attached to the active side 208 of the ASIC 206 with the die attach adhesive 210. The wire-bonded die 214 is mounted having an offset substantially exposing the bond wires 212 connected to the active side 208 of the ASIC 206.

Above the wire-bonded die 214, the bond wires 212 connect the active side 216 of the wire-bonded die 214 to the substrate 202. The inner stacking module 104 is mounted above the wire-bonded die 214. Between the inner stacking module 104 and the wire-bonded die 214 is an adhesive such as penetrable film adhesive 218.

The penetrable film adhesive 218 has a low viscosity and, as temperature increases, the viscosity gets lower. Therefore, the penetrable film adhesive 218 can be easily pressed over the bond wires 212 and then cured to harden the penetrable film adhesive 218.

The inner stacking module 104 is shown having an inner stacking module encapsulation 220. The molded integral step 106 may be molded in the inner stacking module encapsulation 220.

The inner stacking module 104 is shown having an inner stacking module substrate 222 such as a laminated plastic or ceramic substrate. Below the inner stacking module substrate 222 is attached an integrated circuit such as a wire-bonded inner stacking module die 224 with an active side 226.

The wire-bonded inner stacking module die 224 is connected to the inner stacking module substrate 222 with a bond wire 212 from the active side 226. The wire-bonded inner stacking module die 224 is contained in the inner stacking module encapsulating 220 and is larger than the, molded integral step 106.

It has been unexpectedly discovered that the implementation of the molded integral step 106 reduces the complexity of the integrated circuit package system 100 increasing line yield. The molded integral step 106 also reduces process steps and internal components like silicon spacers and extra adhesive layers.

Between the molded integral step 106 of the inner stacking module 104 and the ASIC 206 is an adhesive such as an epoxy 228. Above the inner stacking module 104, the bond wires 212 connect the inner stacking module 104 to the substrate 202.

Further, the encapsulation 102 is shown encapsulating the ASIC 206, the wire-bonded die 214, and the inner stacking module 104. The encapsulation 102 is also shown formed between a planar bottom surface 230 of the molded integral step 106 and the ASIC 206.

Figure 3:
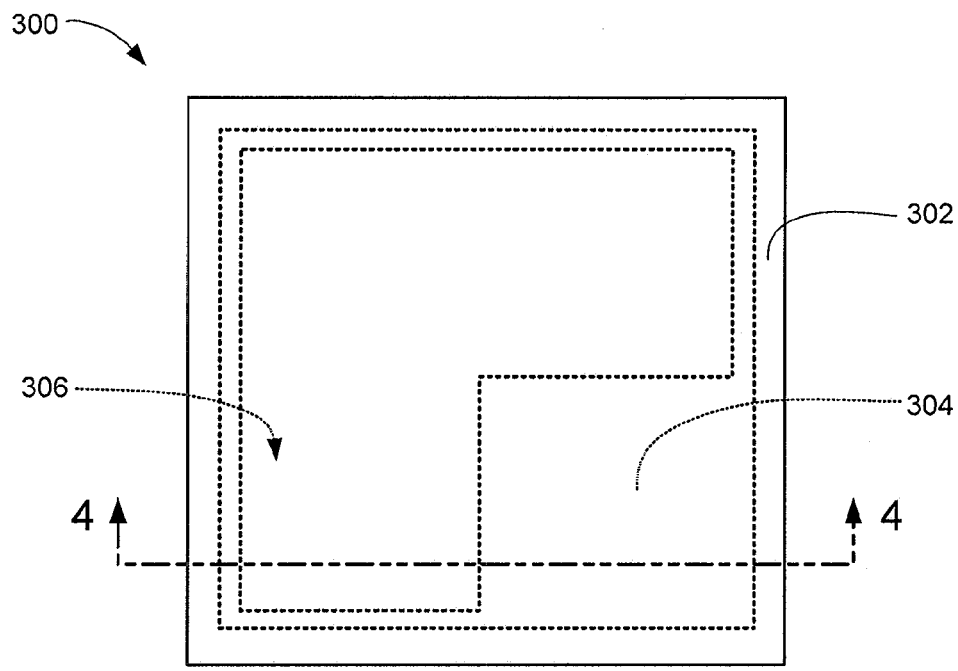
FIG. 3 is a top view of an integrated circuit package system, in a second embodiment of the present invention.

Referring now to FIG. 3, therein is shown a top view of an integrated circuit package system 300 in a second embodiment of the present invention. The integrated circuit package system 300 is shown having an encapsulation 302, such as an EMC.

The encapsulation 302 is shown encapsulating an inner stacking module 304. The inner stacking module 304 is shown having a molded integral step 306 largely comprising three quadrants beneath the inner stacking module 304.

Figure 4:
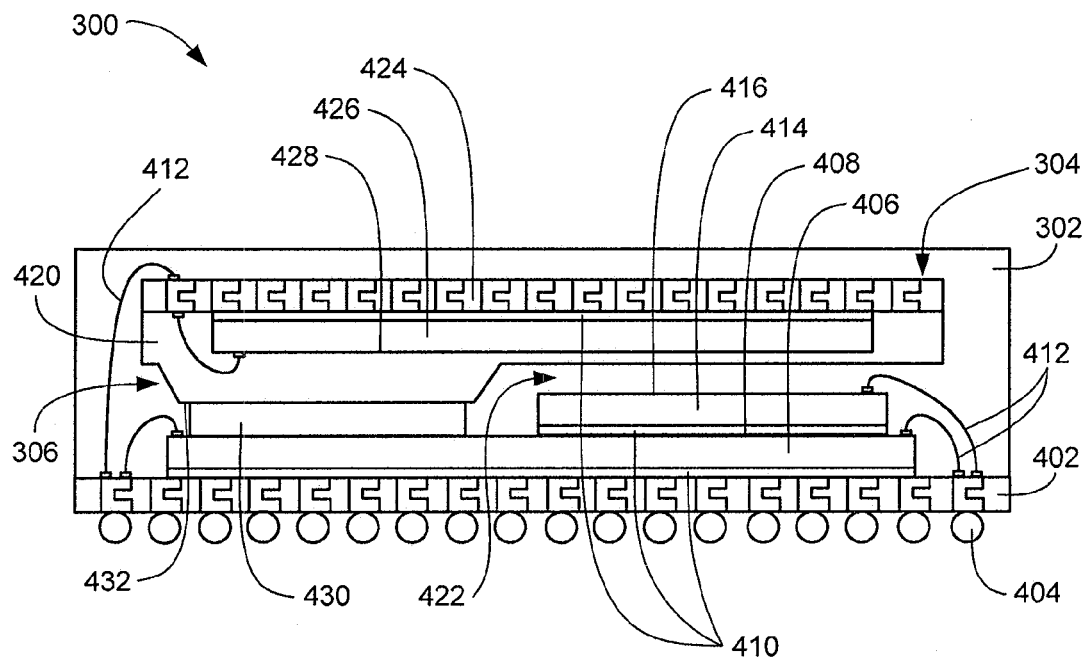
FIG. 4 is a cross sectional view of the integrated circuit package system along the line 4-4 of FIG. 3.

Referring now to FIG. 4, therein is shown a cross sectional view of the integrated circuit package system 300 along the line 4-4 of FIG. 3. The integrated circuit package system 300 is shown having a substrate 402, such as a laminated plastic or ceramic substrate.

Below the substrate 402 are attached external interconnects, such as solder balls 404. Above the substrate 402 is mounted an integrated circuit, such as an ASIC 406 with an active side 408.

The ASIC 406 is attached to the substrate 402 with a die attach adhesive 410. The ASIC 406 is connected to the substrate 402 with bond wires 412 attached to the active side 408. Above the ASIC 406 is mounted a wire-bonded die 414, such as an analog integrated circuit, with an active side 416.

The wire-bonded die 414 is attached to the active side 408 of the ASIC 406 with the die attach adhesive 410. The wire-bonded die 414 is mounted having an offset substantially exposing the bond wires 412 connected to the active side 408 of the ASIC 406.

Above the wire-bonded die 414, the bond wires 412 connect the active side 416 of the wire-bonded die 414 to the substrate 402. The inner stacking module 304 is mounted above the wire-bonded die 414. The inner stacking module 304 is shown having an inner stacking module encapsulation 420.

The molded integral step 306 may be molded in the inner stacking module encapsulation 420. The molded integral step 306 creates a gap 422 between the wire-bonded die 414 and the inner stacking module 304. The molded integral step 306 size will control the gap 422 size. For instance, a larger molded integral step 306 will create a larger gap 422.

The encapsulation 302 fills the gap 422 between the inner stacking module 304 and the wire-bonded die 414.

The inner stacking module 304 is shown having an inner stacking module substrate 424 such as a laminated plastic or ceramic substrate. Below the inner stacking module substrate 424 is attached an integrated circuit such as a wire-bonded inner stacking module die 426 with an active side 428.

The wire-bonded inner stacking module die 426 is connected to the inner stacking module substrate 424 with a bond wire 412 from the active side 428.

It has been unexpectedly discovered that the implementation of the molded integral step 306 reduces the complexity of the integrated circuit package system 300 increasing line yield. The molded integral step 306 also reduces process steps and internal components like silicon spacers and extra adhesive layers.

Between the molded integral step 306 of the inner stacking module 304 and the ASIC 406 is an adhesive such as an epoxy 424. Above the inner stacking module 304, the bond wires 412 connect the inner stacking module 304 to the substrate 402.

The encapsulation 302 is shown encapsulating the ASIC 406, the wire-bonded die 414, and the inner stacking module 304. The encapsulation 302 is also shown formed between a planar bottom surface 432 of the molded integral step 306 and the ASIC 406.

Figure 5:
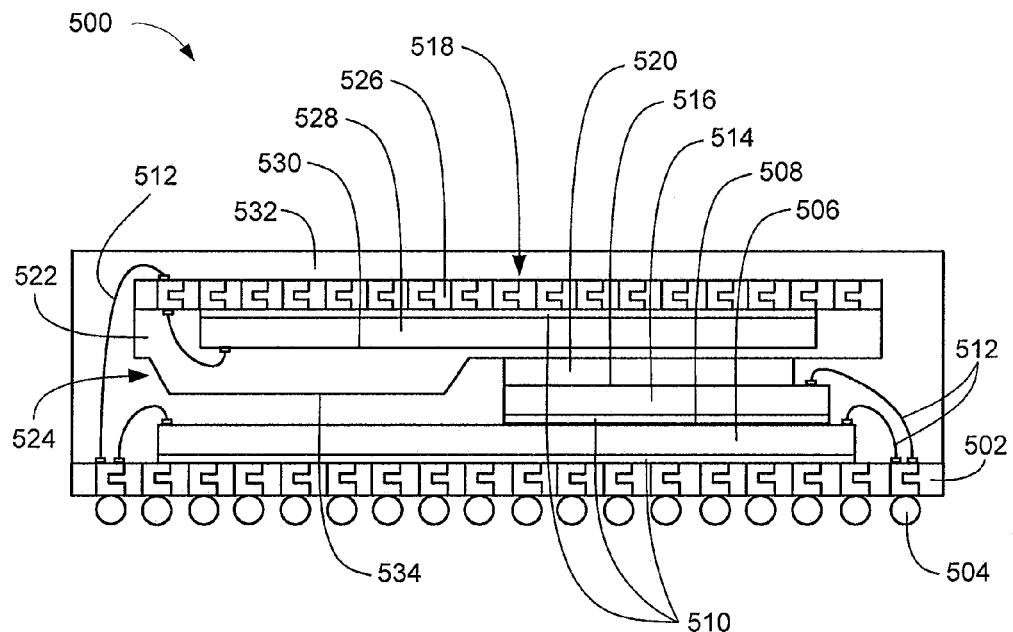
FIG. 5 is a cross sectional view of the integrated circuit package system in a third embodiment of the present invention.

Referring now to FIG. 5, therein is shown a cross sectional view of the integrated circuit package system 500 in a third embodiment of the present invention. The integrated circuit package system 500 is shown having a substrate 502, such as a laminated plastic or ceramic substrate.

Below the substrate 502 are attached external interconnects, such as solder balls 504. Above the substrate 502 is mounted an integrated circuit, such as an ASIC 506 with an active side 508.

The ASIC 506 is attached to the substrate 502 with a die attach adhesive 510. The ASIC 506 is connected to the substrate 502 with bond wires 512 attached to the active side 508. Above the ASIC 506 is mounted a wire-bonded die 514, such as an analog integrated circuit, with an active side 516.

The wire-bonded die 514 is attached to the active side 508 of the ASIC 506 with the die attach adhesive 510. The wire-bonded die 514 is mounted having an offset substantially exposing the bond wires 512 connected to the active side 508 of the ASIC 506.

Above the wire-bonded die 514, the bond wires 512 connect the active side 516 of the wire-bonded die 514 to the substrate 502. An inner stacking module 518 is mounted above the wire-bonded die 514. Between the inner stacking module 518 and the wire-bonded die 514 is an adhesive such as an epoxy 520.

The inner stacking module 518 is shown having an inner stacking module encapsulation 522. A molded integral step 524 may be molded in the inner stacking module encapsulation 522.

The inner stacking module 518 is shown having an inner stacking module substrate 526 such as a laminated plastic or ceramic substrate. Below the inner stacking module substrate 526 is attached an integrated circuit such as a wire-bonded inner stacking module die 528 with an active side 530.

The wire-bonded inner stacking module die 528 is connected to the inner stacking module substrate 526 with a bond wire 512 from the active side 530.

It has been unexpectedly discovered that the implementation of the molded integral step 524 reduces the complexity of the integrated circuit package system 500 increasing line yield. The molded integral step 524 also reduces process steps and internal components like silicon spacers and extra adhesive layers.

An encapsulation 532 fills between the molded integral step 524 of the inner stacking module 518 and the ASIC 506. Above the inner stacking module 518, the bond wires 512 connect the inner stacking module 518 to the substrate 502. The encapsulation 532 is also shown formed between a planar bottom surface 534 of the molded integral step 524 and the ASIC 506.

The encapsulation 526 is shown encapsulating the ASIC 506, the wire-bonded die 514, and the inner stacking module 518.

Figure 6:
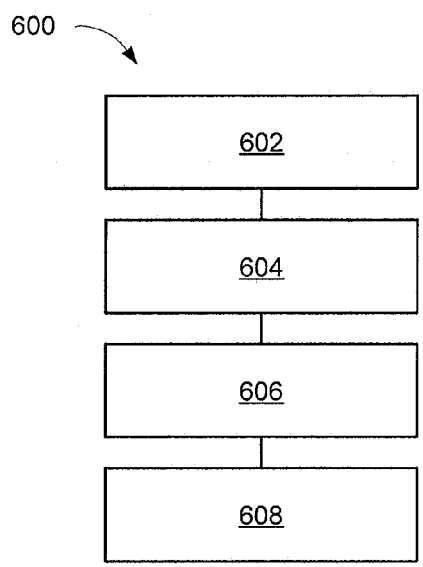
FIG. 6 is a flow chart of an integrated circuit package system for manufacture of an integrated circuit package system in an embodiment of the present invention.

Referring now to FIG. 6, therein is shown a flow chart of an integrated circuit package system 600 for manufacture of an integrated circuit package with a step molded inner stacking module package in package system in an embodiment of the present invention. The system 600 includes providing a substrate in a block 602; mounting an integrated circuit above the substrate in a block 604; mounting an inner stacking module having an inner stacking module encapsulation and a molded integral step molded in the inner stacking module encapsulation in a block 606; and encapsulating the inner stacking module, and the integrated circuit with an encapsulation in a block 608.

It has been discovered that the present invention thus has numerous aspects.

A principle aspect that has been unexpectedly discovered is that the present invention eliminates the need for silicon spacers and additional adhesives to support the inner stacking module over the ASIC.

Another aspect is the elimination of additional process steps that consume money and valuable production time as well as increasing the risk of error by eliminating the amount of components in the integrated circuit package in package system.

Yet another important aspect of the present invention is that it valuably supports and services the historical trend of reducing costs, simplifying systems, and increasing performance.

These and other valuable aspects of the present invention consequently further the state of the technology to at least the next level.

The resulting configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package in package system comprising:
   providing a substrate;
   mounting an integrated circuit above the substrate;
   mounting an inner stacking module, having an inner stacking module encapsulation and a molded integral step, with a planar bottom surface, molded in the inner stacking module encapsulation containing an inner stacking module die larger than the molded integral step, above the integrated circuit; and
   forming an encapsulation covering the inner stacking module, and the integrated circuit with the encapsulation between the planar bottom surface of the molded integral step and the integrated circuit.

2. The method as claimed in claim 1 wherein:
mounting the inner stacking module having the molded integral step includes having the molded integral step largely comprising one quadrant beneath the inner stacking module.

3. The method as claimed in claim 1 wherein:
mounting the inner stacking module having the molded integral step includes having the molded integral step largely comprising three quadrants beneath the inner stacking module.

4. The method as claimed in claim 1 further comprising:
mounting an epoxy between the integrated circuit and the molded integral step.

5. The method as claimed in claim 1 further comprising:
mounting a penetrable film adhesive between on the integrated circuit.

6. A method for manufacturing an integrated circuit package in package system comprising:
providing a substrate;
mounting an integrated circuit above the substrate;
mounting a wire-bonded die above the integrated circuit;
connecting the integrated circuit and the wire-bonded die to the substrate with a wire bond;
mounting an inner stacking module, having an inner stacking module encapsulation and a molded integral step, with a planar bottom surface, molded in the inner stacking module encapsulation containing an inner stacking module die larger than the molded integral step, above the integrated circuit; and
forming an encapsulation covering the inner stacking module, and the integrated circuit with the encapsulation between the planar bottom surface of the molded integral step and the integrated circuit.

7. The method as claimed in claim 6 further comprising:
mounting a penetrable film adhesive between the wire-bonded die and the inner stacking module.

8. The method as claimed in claim 6 further comprising:
mounting an epoxy between the wire-bonded die and the inner stacking module.

9. The method as claimed in claim 6 wherein:
mounting the inner stacking module having the molded integral step above the integrated circuit includes creating a gap between the integrated circuit and the inner stacking module and filling the gap with encapsulation.

10. The method as claimed in claim 6 wherein:
mounting an inner stacking module having a molded integral step above the integrated circuit includes creating a gap between the integrated circuit and the inner stacking module and the gap size is controlled by the molded integral step size.

11. An integrated circuit package in package system comprising:
a substrate;
an integrated circuit mounted above the substrate;
an inner stacking module, having an inner stacking module encapsulation and a molded integral step, with a planar bottom surface, molded in the inner stacking module encapsulation containing an inner stacking module die larger than the molded integral step, above the integrated circuit; and
an encapsulation covering the inner stacking module, and the integrated circuit with the encapsulation between the planar bottom surface of the molded integral step and the integrated circuit.

12. The system as claimed in claim 11 wherein:
the inner stacking module having the molded integral step includes having the molded integral step largely comprising one quadrant beneath the inner stacking module.

13. The system as claimed in claim 11 wherein:
the inner stacking module having the molded integral step includes having the molded integral step largely comprising three quadrants beneath the inner stacking module.

14. The system as claimed in claim 11 further comprising:
an epoxy mounted between the integrated circuit and the molded integral step.

15. The system as claimed in claim 11 further comprising:
a penetrable film adhesive on the integrated circuit.

16. The system as claimed in claim 11 further comprising:
a wire-bonded die mounted above the integrated circuit;
the integrated circuit and the wire-bonded die connected to the substrate with a wire bond; and
the wire-bonded die encapsulated by the encapsulation.

17. The system as claimed in claim 16 further comprising:
a penetrable film adhesive mounted between the wire-bonded die and the inner stacking module.

18. The system as claimed in claim 16 further comprising:
an epoxy mounted between the wire-bonded die and the inner stacking module.

19. The system as claimed in claim 16 further comprising:
a gap between the wire-bonded die and the inner stacking module filled with the encapsulation.

20. The system as claimed in claim 16 further comprising:
a gap between the wire-bonded die and the inner stacking module having the gap size controlled by the molded integral step size.

* * * * *